(12) United States Patent
Yang et al.

(10) Patent No.: US 7,439,098 B2
(45) Date of Patent: Oct. 21, 2008

(54) SEMICONDUCTOR PACKAGE FOR ENCAPSULATING MULTIPLE DIES AND METHOD OF MANUFACTURING THE SAME

(75) Inventors: Jun-Young Yang, Paju-Si (KR); Tae-Seog Kim, Paju-Si (KR); You-Ock Joo, Paju-Si (KR)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 26 days.

(21) Appl. No.: 11/221,812

(22) Filed: Sep. 9, 2005

(65) Prior Publication Data

US 2007/0087471 A1    Apr. 19, 2007

(51) Int. Cl.
*H01L 21/00* (2006.01)
(52) U.S. Cl. ..................................... 438/106
(58) Field of Classification Search ......... 257/678–693, 257/772, 723, 734–738, E21.499; 438/106, 438/121
See application file for complete search history.

(56) References Cited

U.S. PATENT DOCUMENTS

| | | | | |
|---|---|---|---|---|
| 5,455,456 A | * | 10/1995 | Newman | 257/704 |
| 7,084,511 B2 | * | 8/2006 | Matsuda | 257/775 |
| 7,205,613 B2 | * | 4/2007 | Fjelstad et al. | 257/355 |
| 7,268,417 B2 | * | 9/2007 | Ochi et al. | 257/679 |
| 2003/0197278 A1 | * | 10/2003 | Joshi et al. | 257/772 |
| 2004/0046250 A1 | * | 3/2004 | Chua et al. | 257/723 |
| 2005/0224938 A1 | * | 10/2005 | Kim | 257/678 |
| 2005/0236709 A1 | * | 10/2005 | Eng et al. | 257/737 |
| 2006/0043549 A1 | * | 3/2006 | Hsu | 257/678 |
| 2006/0108672 A1 | * | 5/2006 | Brennan et al. | 257/676 |
| 2006/0118928 A1 | * | 6/2006 | Takita | 257/678 |
| 2006/0263929 A1 | * | 11/2006 | Matsunami | 438/106 |

* cited by examiner

*Primary Examiner*—Nathan W Ha
(74) *Attorney, Agent, or Firm*—Bacon & Thomas, PLLC

(57) ABSTRACT

A semiconductor package comprises a silicon substrate having an insulative surface; a patterned metal layer, formed on the insulative surface of the silicon substrate; an insulation layer formed on the patterned metal layer, and the patterned metal layer being partially exposed for functioning as at least a set of the device attaching pads and ball attaching pads; at least a device electrically connected to the set of the device attaching pads; a sealing compound for covering portions of the insulative surface of the silicon substrate and encapsulating the devices; and a plurality of solder balls attached to the set of ball attaching pads.

20 Claims, 6 Drawing Sheets

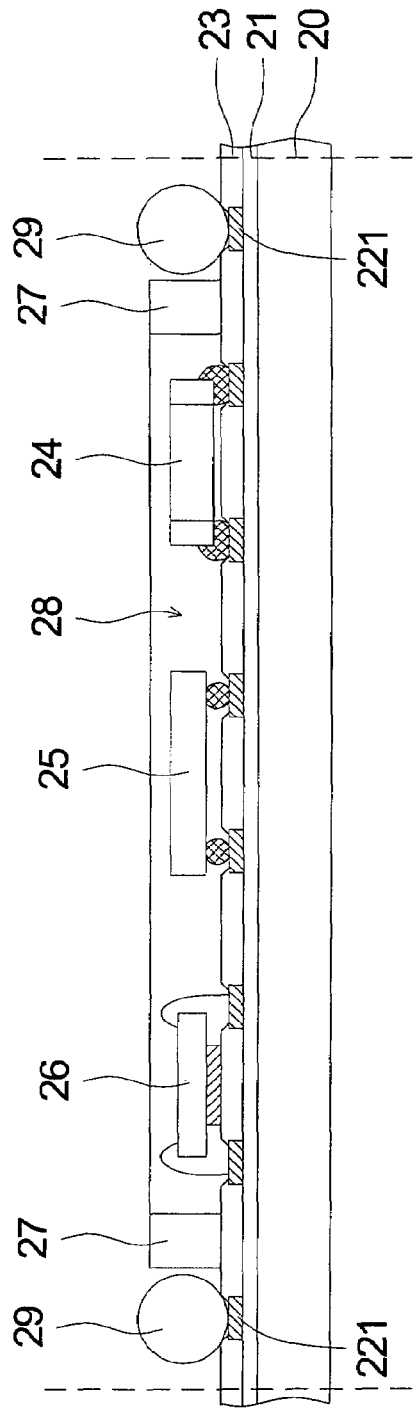
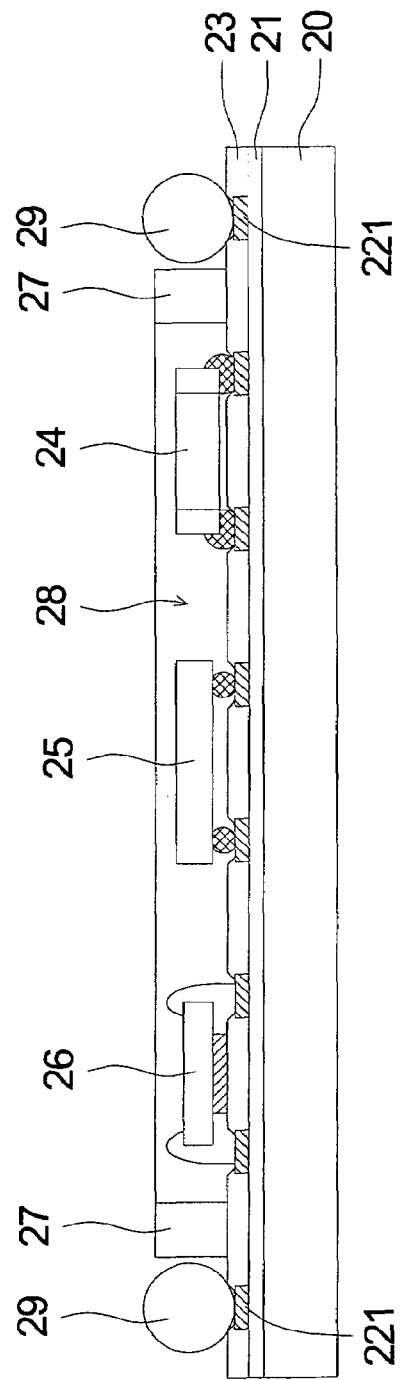

SEMICONDUCTOR PACKAGE FOR ENCAPSULATING MULTIPLE DIES AND METHOD OF MANUFACTURING THE SAME

BACKGROUND OF THE INVENTION

1. Field of the Invention

The invention relates in general to a semiconductor package and method of manufacturing the same, and more particularly to a compact system in a System-in-Package (SiP) and method of manufacturing the same.

2. Description of the Related Art

In the recent years, the electronic devices, especially the portable products (e.g. digital mobile phone, digital camera and personal digital assistant), have been widely used. To meet the demand of the growing market, the semiconductor manufacturers face many challenges in supplying suitable electronic device of the electronic devices. One of the challenges is to provide the customers with a thin, light, but powerful device. Also, this device is much attractive if it is cost is much lower. System-in-Package (SiP) is emerging as a strong contender as the solution to facilitate the needs of these market applications.

FIG. 1 is a cross-sectional view of a conventional compact system in a System-in-Package. First, a carrier 10 such as a portion of a lead frame is provided. The first die 11 is attached to the carrier 10, and then the second die 12 is attached to the topside of the first die 11. Also, an adhesive material (not shown) is needed to complete the attachment of the first die 11 to the carrier 10, and the second die 12 to the first die 11. The first die 11 and the second die 12 possess different functions; for example, the former is a memory and the latter is a processor. Then, the first die 11 and the second die 12 are electrically connected to the connecting pads (not shown) of the carrier 10 by the first wires 113 and the second wires 123, respectively. Next, a molding compound 15 is used for encapsulating the first die 11, the second die 12, the first wires 113 and the second wires 123. Besides the package 1 with two wire-bonded dies, other compact package in SiP with different die bonding, such as a package with two dies bonded by flip-chip method, is also developed. However, the multiple dies integrated in a package by the conventional techniques generally make a thick and bulky package.

Also, the material of the molding compound 15, generally the thermoplastics or thermoset resins (such as silicons, phenolics and epoxies) is different from the carrier 10. Thus, the reliability of the package can be decreased due to the thermal expansion difference between the molding compound 15 and the carrier 10.

SUMMARY OF THE INVENTION

It is therefore an object of the invention to provide a semiconductor package and method of manufacturing the same, and the present product of the semiconductor package is high-density, and much thinner and lighter than the conventional product.

The invention achieves the objects by providing a method of manufacturing a semiconductor package. First, a silicon substrate having an insulative surface is provided, and the silicon substrate is virtually divided into a plurality of package units. At least one patterned metal layer is formed on the insulative surface of the silicon substrate. Next, at least one insulation layer is formed on the patterned metal layer, and the patterned metal layer is partially exposed for functioning as plural sets of the device attaching pads and ball attaching pads. A plurality of devices are electrically connected to the sets of the device attaching pads, and each package unit of the silicon substrate at least comprises one device and one set of the ball attaching pads. Then, a dam block is formed at a periphery of each package unit to form a filling region, and the ball attaching pads of each package unit are positioned outside the dam block. The filling regions of the package units are then filled with a sealing compound, for covering portions of the insulative surface of the silicon substrate and encapsulating the devices. Next, the solder balls are attached to the sets of ball attaching pads. The package units of the silicon substrate are separated for forming a plurality of independent semiconductor packages.

The invention achieves the objects by providing a semiconductor package, comprising: a silicon substrate having an insulative surface; a patterned metal layer, formed on the insulative surface of the silicon substrate; an insulation layer formed on the patterned metal layer, and the patterned metal layer being partially exposed for functioning as at least a set of the device attaching pads and ball attaching pads; at least a device electrically connected to the set of the device attaching pads; a sealing compound for covering portions of the insulative surface of the silicon substrate and encapsulating the devices; and a plurality of solder balls attached to the set of ball attaching pads.

Other objects, features, and advantages of the invention will become apparent from the following detailed description of the preferred but non-limiting embodiment. The following description is made with reference to the accompanying drawings.

BRIEF DESCRIPTION OF THE DRAWINGS

FIG. 2A-FIG. 2G schematically illustrate a method of manufacturing the semiconductor package according to the embodiment of the invention.

FIG. 3 depicts a cross-sectional view of an independent semiconductor package according to the embodiment of the invention.

DETAILED DESCRIPTION OF THE INVENTION

The embodiment disclosed herein is for illustrating the invention, but not for limiting the scope of the invention. Additionally, the drawings used for illustrating the embodiment of the invention only show the major characteristic parts in order to avoid obscuring the invention. Accordingly, the specification and the drawings are to be regard as an illustrative sense rather than a restrictive sense.

Figure 1:
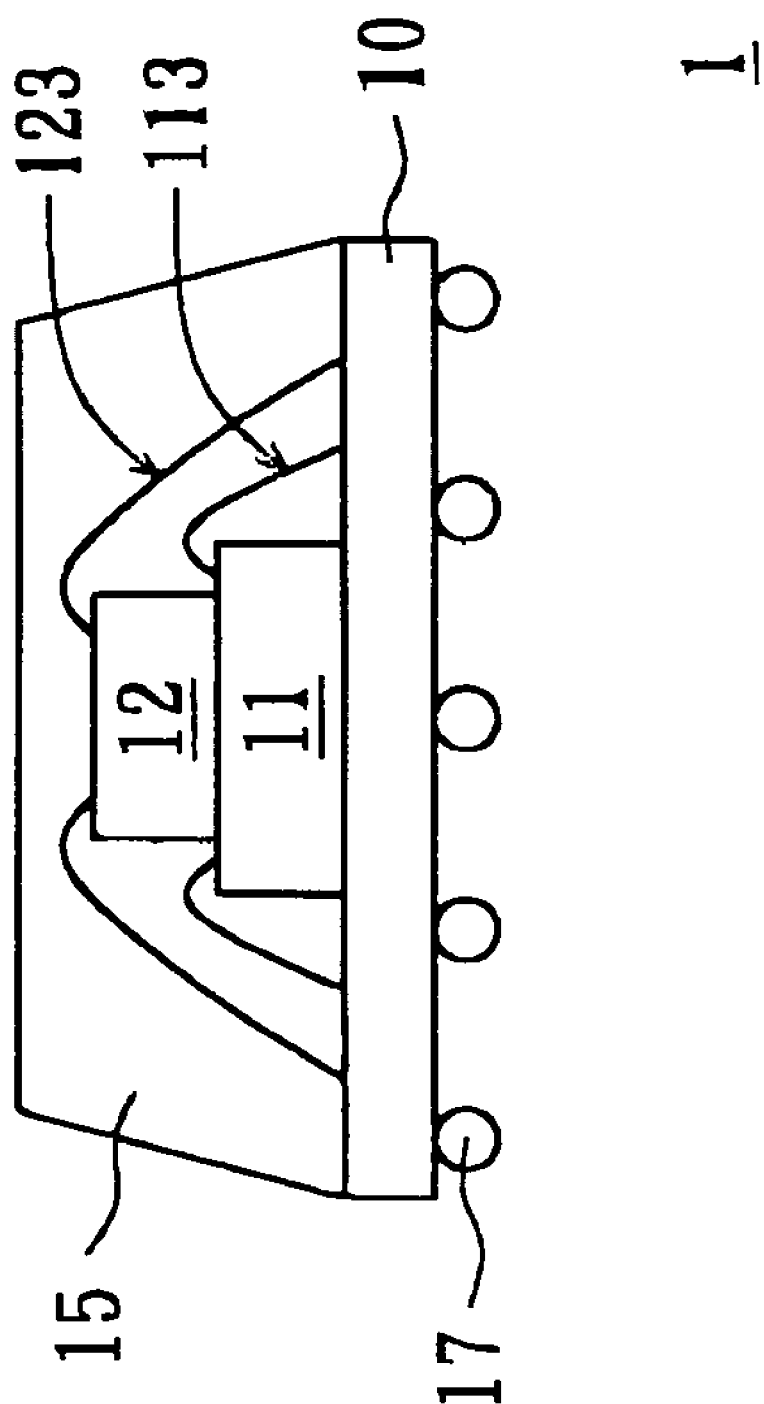
FIG. 1 (prior art) is a cross-sectional view of a conventional compact system in a System-in-Package.
Figure 2A:

FIG. 2A-FIG. 2G schematically illustrate a method of manufacturing the semiconductor package according to the embodiment of the invention. First, a silicon substrate 20 having an insulative surface 21 is provided, as shown in FIG. 2A. The silicon substrate 20 could be a silicon wafer. The insulative surface 21 could be formed by depositing a first dielectric layer made of low-dielectric material on the silicon substrate 20. Examples of the low dielectric material include benzocyclobutane (BCB), polyimide (PI), and the like. Also, the silicon substrate 20 is divided into a plurality of package units. For purpose of simplicity, only one package unit is depicted in FIG. 2A-FIG. 2G.

Figure 2B:
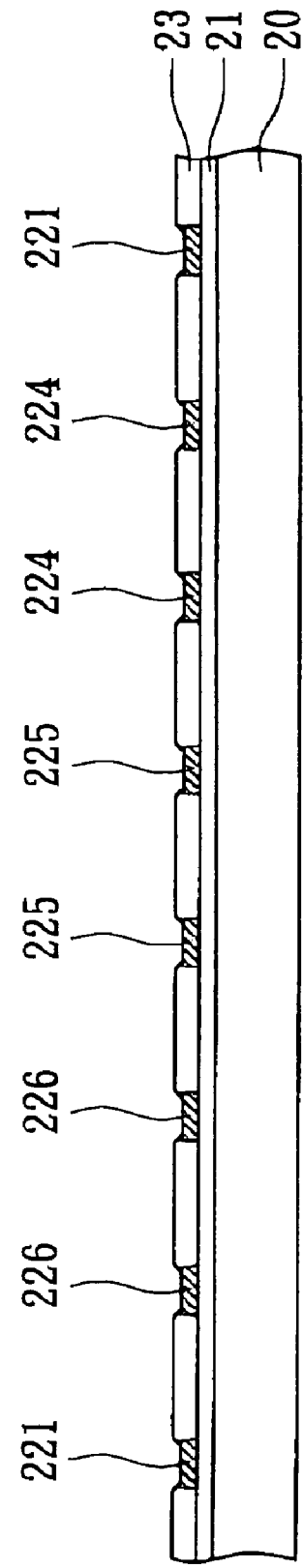

After the formation of the insulative surface 21, at least one patterned metal layer is formed on the insulative surface 21 of the silicon substrate 20, and at least one insulation layer 23 is formed on the patterned metal layer, wherein the patterned metal layer being partially exposed for functioning as plural sets of the device attaching pads and ball attaching pads. In this preferred embodiment, three sets of the device attaching pads 224, 225, 226 and one set of the ball attaching pads 221 are depicted as shown in FIG. 2B. The insulation layer 23 could be a second dielectric layer made of low-dielectric material, such as benzocyclobutane (BCB), polyimide (PI) and the like.

After the formation of the device attaching pads and the ball attaching pads, the attachment and electrical connection of the devices is performed. The devices could be any component required in the application, such as a capacitor, a switch module, a memory, a processor, a power amplifier and so on. Also, a variety of commonly known methods can be used for accomplishing the device bonding.

Figure 2C:
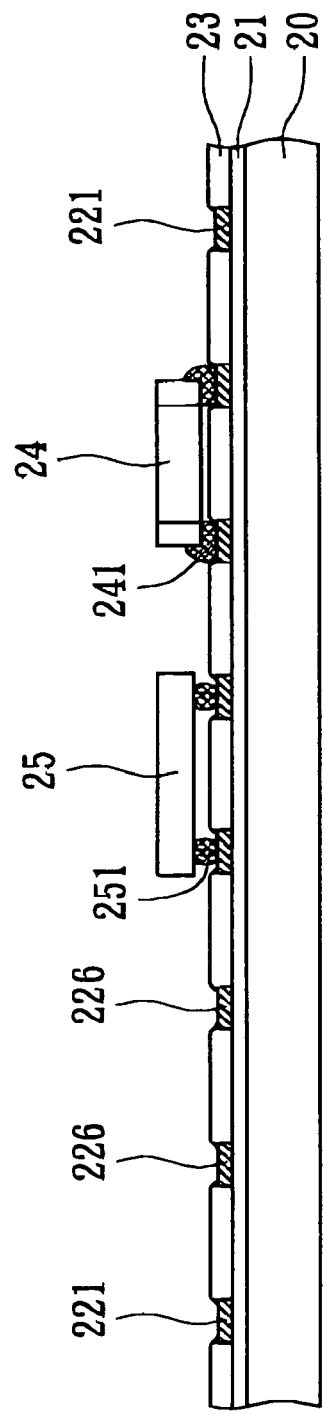

As shown in FIG. 2C, a first die 24 such as a passive component is attached to the device attaching pads 224 by a solder bonding method. In the application, a proper amount of solder paste 241 can be coated/printed on the sets of the device attaching pads and/or the first die 24, and the first die 24 is electrically connected to the device attaching pads 224. Also, a second die 25 such as a flip-chip die is attached to the device attaching pads 225 by a flip-chip bonding method. For example, a plurality of conductive bumps (such as solder bumps) 251 are formed at the sets of the device attaching pads 225, and the second die 25 is electrically connected to the device attaching pads 225. After the attachment of the passive component (i.e. the first die 24) and the flip-chip die (i.e. the second die 25), the conductive bumps (such as solder bumps) 251 and solder paste 241 are reflowed for a permanent connection.

Figure 2D:
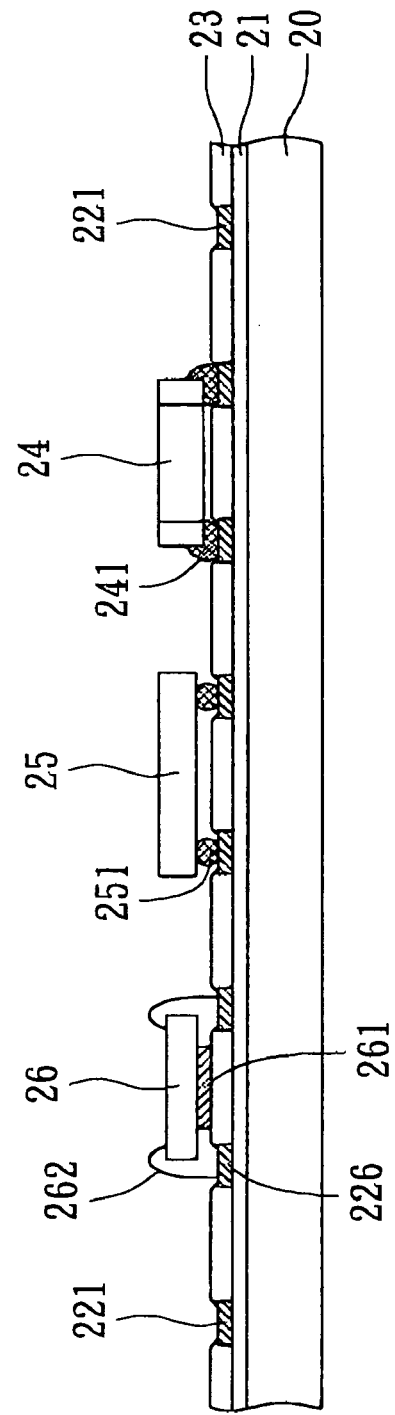

In this embodiment, the wire bonding method can also be used for accomplishing the electrical connection of the devices. As shown in FIG. 2D, a third die 26 is attached to the insulation layer 23 through an adhesive (such as epoxy) 261, and electrically connected to the device attaching pads 226 by the wires 262.

Figure 2E:
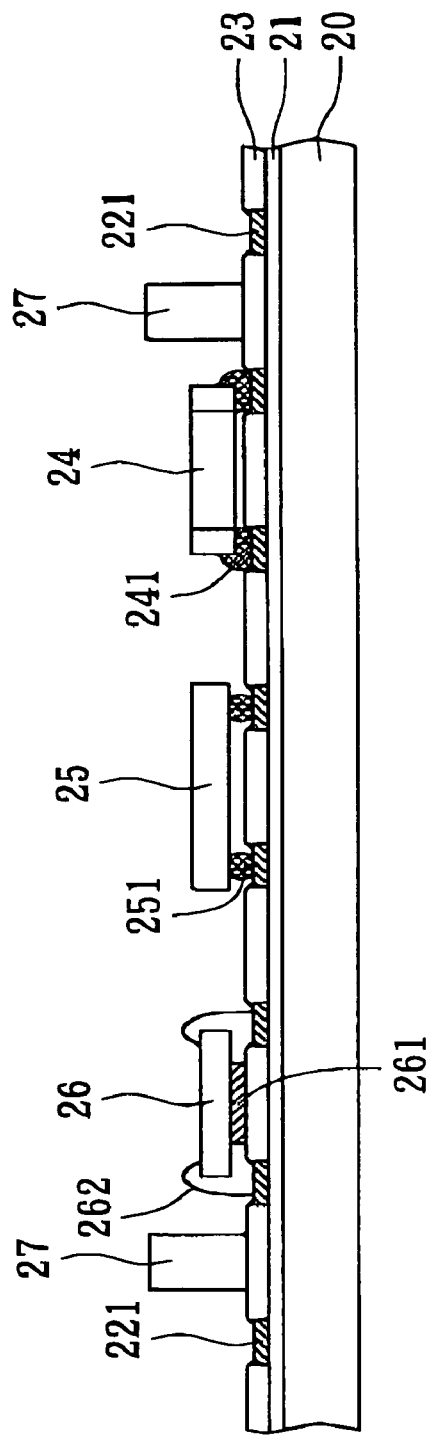
Figure 2F:
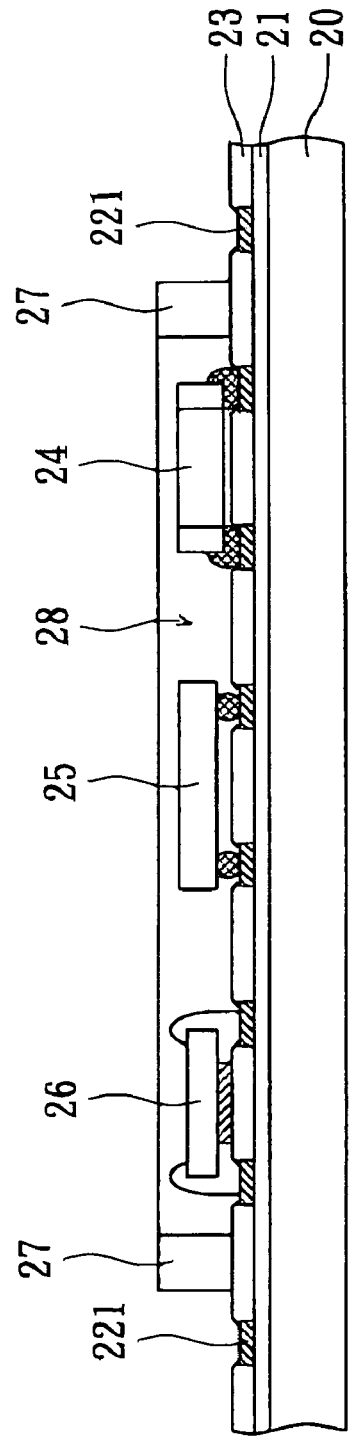

After the attachment and electrical connection of the devices, a dam block 27 is formed at a periphery of each package unit, and the set of ball attaching pads 221 of the package unit is positioned outside the dam block 27, as shown in FIG. 2E. The dam block 27 surrounding the first die 24, the second die 25 and the third die 26 forms a filling region of this package unit, and the filling region is then filled with a sealing compound 28, for covering portions of the insulative surface 21 of the silicon substrate 20 and encapsulating the devices (i.e. the first die 24, the second die 25 and the third die 26), as shown in FIG. 2F.

Figure 4:
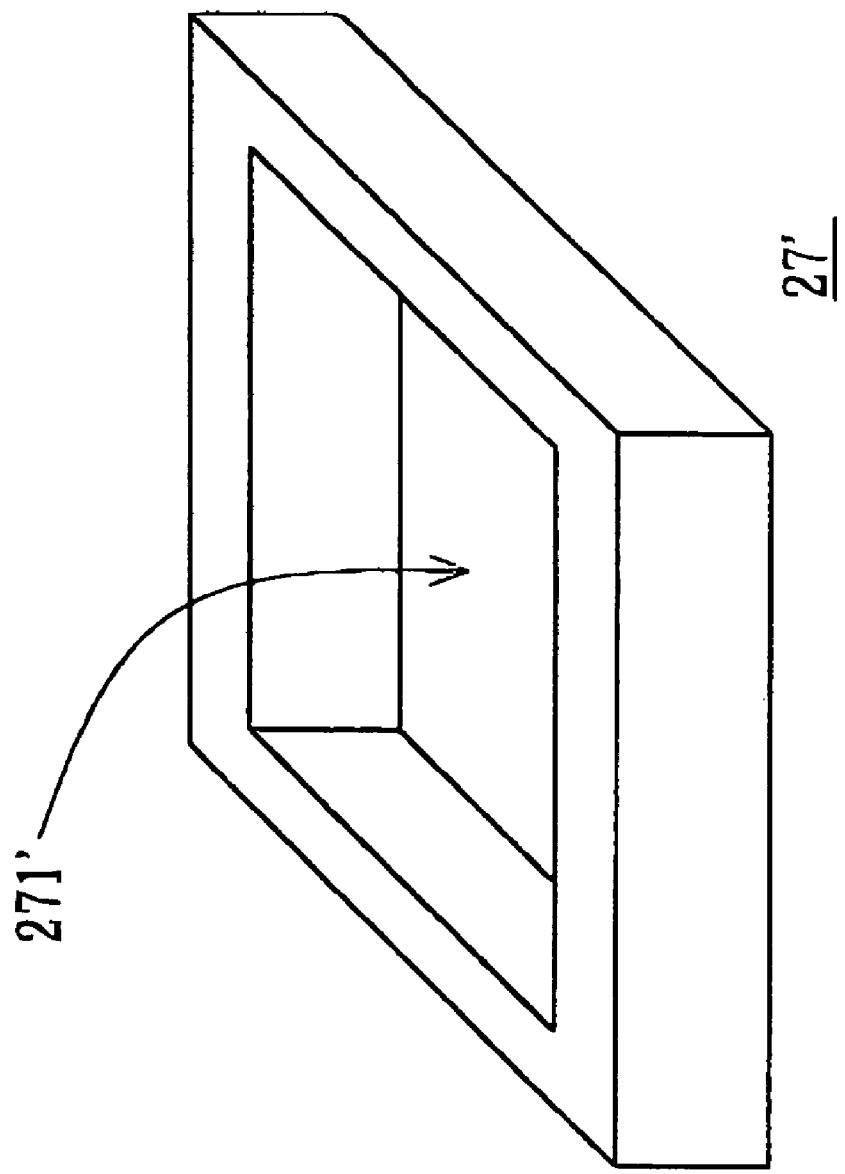
FIG. 4 schematically illustrates a pre-formed dam block according to the embodiment of the invention.

It is noted that a sealing matter can be injected at the periphery of each package unit to form the dam block 27, or a endless band 27' as shown in FIG. 4 is pre-formed and disposed at the periphery of each package unit as the dam block 27. In FIG. 4, the space encircled by the endless band 27' is the filling region 271' for filling with the sealing compound 28. Besides, both of the dam block 27 and the sealing compound 28 can be made of the same insulative substance.

After the encapsulation of the devices, the solder balls 29 are attached to the ball attaching pads 221, and the singulation of the silicon substrate 20 (i.e. separating the package units as the individuals) is performed as shown in FIG. 2G. After the singulation, the independent semiconductor package unit is electrically connected to the printed circuit board (PCB) via the solder balls 29 for the application (not shown in FIG. 2G).

FIG. 3 depicts a cross-sectional view of an independent semiconductor package according to the embodiment of the invention. For purpose of simplicity, elements common to FIG. 2A-FIG. 2G are numbered identically in FIG. 3. According to FIG. 3, each semiconductor package (i.e. the package unit of FIG. 2G) comprises a silicon substrate 20 having an insulative surface 21; a patterned metal layer formed on the insulative surface 21; an insulation layer 23 formed on the patterned metal layer and being partially exposed for functioning as at least a set of the device attaching pads and ball attaching pads 221; three devices (i.e. the first die 24, the second die 25 and the third die 26) electrically connected to the device attaching pads 241, 251, 261; a dam block 27 enclosing the devices; a sealing compound 28 for encapsulating the devices; and the solder balls 29 electrically connected to the device attaching pads 221. The dam block 27 and the sealing compound 28 are preferably made of the same insulative instance.

Although the package unit comprising three devices is illustrated in this embodiment, the number of the device encapsulated in a single package unit is not limited herein. Each package unit could comprise one, two, three, four even more devices, and the devices could be the dies, passive components or a combination thereof, depending on the requirement of the applications. Also, the methods for bonding the devices are optionally selected (such as wire bonding, flip-chip bonding and solder bonding) for accomplishing the appropriate bonding of the devices.

Also, the singulation is performed after the devices are encapsulated and solder balls are attached according to the preferred embodiment (FIG. 2A-FIG. 2G). However, the singulation can be performed before the device attachment. The independent units (i.e. the silicon substrate 21 of each unit only comprising the insulative surface 21, the insulation layer 23 and the patterned metal layer, as shown in FIG. 2B) can be separately positioned on a carrier for conducing the subsequent processes, such as device attachment, formation of dam block, device encapsulation by the sealing compound, and solder ball attachment. The carrier could be any kinds of the materials, depending on the purpose and requirement of the application.

According to the aforementioned description, the embodiment of the invention provides many advantages over conventional package technology. For example, the invention provides a much thinner, lighter and high-density semiconductor package. Also, the compact system in a System-in-Package (SiP) of the present invention using the silicon substrate (instead of the leading frame) as a supporting base increases the reliability of the package. Furthermore, the method for manufacturing the semiconductor package of the invention is simple and well-established, so that the production cost is decreased.

While the invention has been described by way of example and in terms of the preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of manufacturing a semiconductor package, comprising steps of:
   providing a silicon substrate having an insulative surface, and the silicon substrate divided into a plurality of package units;
   forming at least one patterned metal layer on the insulative surface of the silicon substrate;
   forming at least one insulation layer on the patterned metal layer, and the patterned metal layer being partially exposed for functioning as plural sets of the device attaching pads and ball attaching pads;

electrically connecting a plurality of devices to the sets of the device attaching pads, and each package unit of the silicon substrate at least comprising one device and one set of the ball attaching pads;

forming a ringed dam block at a periphery of each package unit to form a closed filling region, and the set of ball attaching pads of the package unit positioned on an exposed surface of the insulation layer of the silicon substrate surrounding the ringed dam block;

filling up the closed filling regions of the package units with a sealing compound, for covering portions of the insulative surface of the silicon substrate and encapsulating the devices, wherein the set of ball attaching pads are spaced apart from the ringed dam block and the sealing compound;

attaching a plurality of solder balls to the sets of ball attaching pads; and separating the package units of the silicon substrate, for forming a plurality of independent semiconductor packages.

2. The method according to claim 1, wherein the insulative surface is provided by forming a low-dielectric layer on the silicon substrate.

3. The method according to claim 1, wherein electrical connection between the devices and the sets of the device attaching pads is performed by one or plural methods selected from wire bonding, flip chip bonding and solder bonding.

4. The method according to claim 3, wherein a plurality of wires are used for electrically connecting the devices to the sets of the device attaching pads while the wire bonding method is selected.

5. The method according to claim 3, wherein the flip chip bonding method is performed by steps of:

forming a plurality of solder bumps at the sets of the device attaching pads; and electrically connecting the devices to the sets of the device attaching pads by reflow.

6. The method according to claim 3, wherein the solder bonding method is performed by steps of:

coating solder paste on the sets of the device attaching pads; and electrically connecting the devices to the sets of the device attaching pads by reflow.

7. The method according to claim 1, wherein a sealing matter is injected at the periphery of each package unit to form the ringed dam block.

8. The method according to claim 1, further comprising step of:

pre-forming the ringed dam block; and disposing the ringed dam block at the periphery of each package unit.

9. The method according to claim 1, further comprising step of:

electrically connecting the independent semiconductor packages to a plurality of printed circuit boards (PCBs) via the solder balls.

10. A semiconductor package, comprising:

a silicon substrate having an insulative surface;

a patterned metal layer, formed on the insulative surface of the silicon substrate;

an insulation layer formed on the patterned metal layer, and the patterned metal layer being partially exposed for functioning as at least a set of the device attaching pads and ball attaching pads;

at least a device, electrically connected to the set of the device attaching pads;

a ringed dam block, surrounding the device to form a closed filling region;

a sealing compound, filling up the closed filling regions and united with the ringed dam block for covering portions of the insulative surface of the silicon substrate and encapsulating the devices; and a plurality of solder balls attached to the set of ball attaching pads, wherein the set of ball attaching pads are spaced apart from the ringed dam block and the sealing compound.

11. The semiconductor package according to claim 10, wherein the set of ball attaching pads is positioned on an exposed surface of the insulation layer of the silicon substrate surrounding the ringed dam block.

12. The semiconductor package according to claim 11, wherein both of the ringed dam block and the sealing compound are made of an insulative substance.

13. The semiconductor package according to claim 10, wherein the insulative surface of the silicon substrate is a low-dielectric layer.

14. The semiconductor package according to claim 13, wherein the low-dielectric layer and the insulation layer comprise benzocyclobutane (BCB).

15. The semiconductor package according to claim 13, wherein the low-dielectric layer and the insulation layer comprise polyimide (PI).

16. The semiconductor package according to claim 10, wherein the insulation layer is made of a low dielectric material.

17. The semiconductor package according to claim 10, wherein the device is electrically connected to the set of the device attaching pads through wire bonding, flip chip bonding or solder bonding.

18. The semiconductor package according to claim 10, wherein the device is a die or a passive component.

19. The semiconductor package according to claim 10 comprising a plurality of devices.

20. The semiconductor package according to claim 19, wherein the devices comprise a plurality of dies, a plurality of passive components, or a combination thereof.

* * * * *